(12) United States Patent
Miyashita et al.

(10) Patent No.: US 7,193,463 B2
(45) Date of Patent: Mar. 20, 2007

(54) DRIVER CIRCUIT

(75) Inventors: Miyo Miyashita, Tokyo (JP); Kazuya Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 90 days.

(21) Appl. No.: 10/922,959

(22) Filed: Aug. 23, 2004

(65) Prior Publication Data

US 2005/0088233 A1 Apr. 28, 2005

(30) Foreign Application Priority Data

Oct. 28, 2003 (JP) ............................. 2003-366895

(51) Int. Cl.
*H03F 3/45* (2006.01)
(52) U.S. Cl. ...................... 330/252; 330/307
(58) Field of Classification Search ................. 330/65, 330/66, 252, 307
See application file for complete search history.

(56) References Cited

U.S. PATENT DOCUMENTS

| 5,525,930 | A | * | 6/1996 | Pothast et al. ............... 330/252 |
| 6,069,523 | A | | 5/2000 | Brown |
| 2003/0107441 | A1 | * | 6/2003 | Grasset et al. ............... 330/302 |
| 2003/0176172 | A1 | * | 9/2003 | Imayama et al. ........... 455/130 |

OTHER PUBLICATIONS

Kehrer, D., et al. "40Gb/s 2:1 Multiplexer in 120nm CMOS." ISSCC Digest of Technical Papers, pp. 344-345, 2003.

Schmid, R., et al. "20Gbit/s transimpedance preamplifier and modular driver in SiGe bipolar technology." IEE Electron. Lett. vol. 33, No. 13, pp. 1136-1137, Jun. 19, 1997.

Chu, Yuan-kai., et al. "5.7GHz.µm COMS Gained- Controlled LNA and Mixer For 802.11a WLAN Applications." 2003 IEEE Radio Frequency Integrated Circuits Symposium, XP010646697, pp. 221-224.

Liao, Che-Hong., et al. "5.7GHz.18µm COMS Gain-Controlled Differntial LNA With Current Reuse for WLAN Receiver." IEEE Microwave and Wireless Components Letters, vol. 13, No. 12, Dec. 12, 2003, XP001190047, pp. 526-528.

European Office Action Issued in corresponding European Patent Application No. 04 024 976.5, dated Oct. 25, 2006.

Rein, H.M. et al., "A Versatile Si-Bipolar Driver Circuit with High Output Voltage Swing for External and Direct Laser Modulation in 10 Gb/s Optical-Fiber Links," IEEE Journal of Solid-State Circuits, vol. 29, No. 9, Sep. 1994, pp. 1014-1021.

* cited by examiner

*Primary Examiner*—Steven J. Mottola
(74) *Attorney, Agent, or Firm*—McDermott Will & Emery LLP

(57) ABSTRACT

In a driver circuit including transistors each having an emitter follower configuration and a pair of differential transistors with emitter outputs of the transistors of the emitter follower configuration as inputs, end terminals of the pair of differential transistors are connected to individual bonding pads, and the respective bonding pads and voltage sources are individually connected by wires that function as inductors. Thereby, even in the case where the lengths of the wires of output terminals change according to packaging, outputs can be matched by determining the wire lengths of the wires suitably.

3 Claims, 17 Drawing Sheets

Fig. 1 2
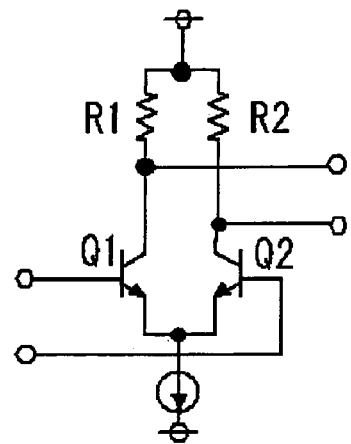
(a)
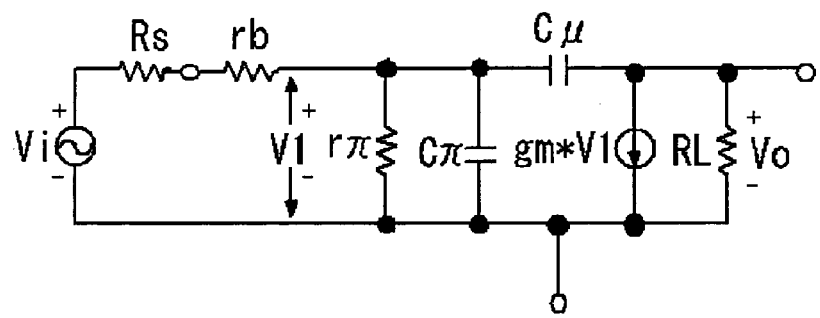
(b)
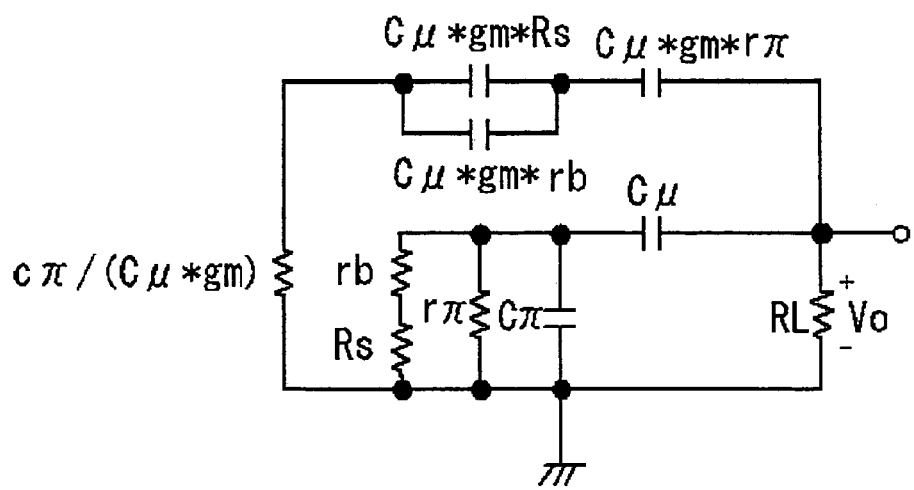
(c)

Fig. 14
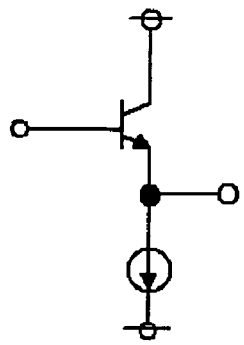
(a)
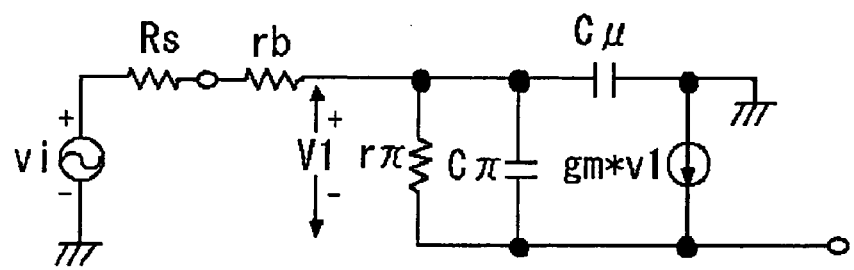
(b)
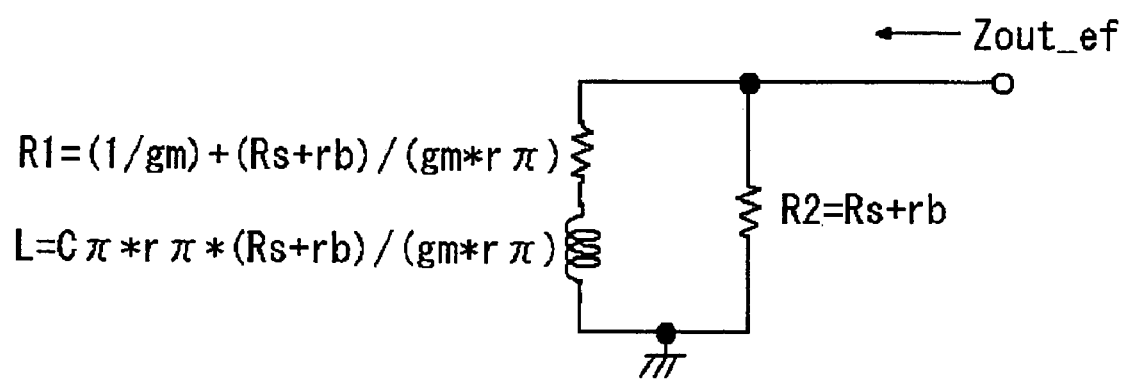
(c)

Fig. 16
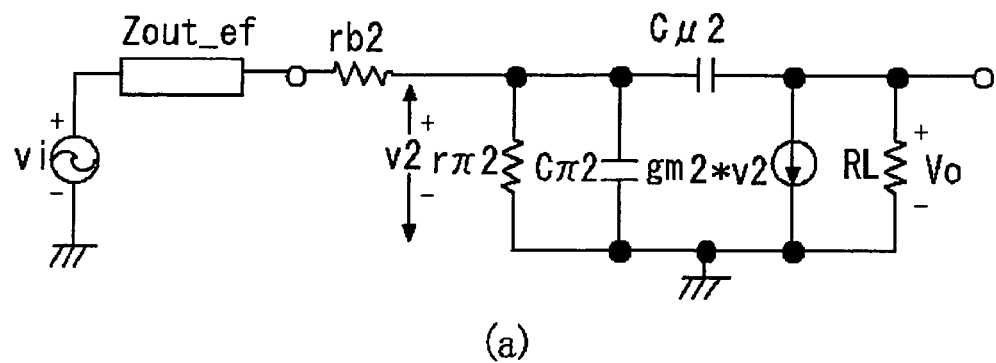
(a)
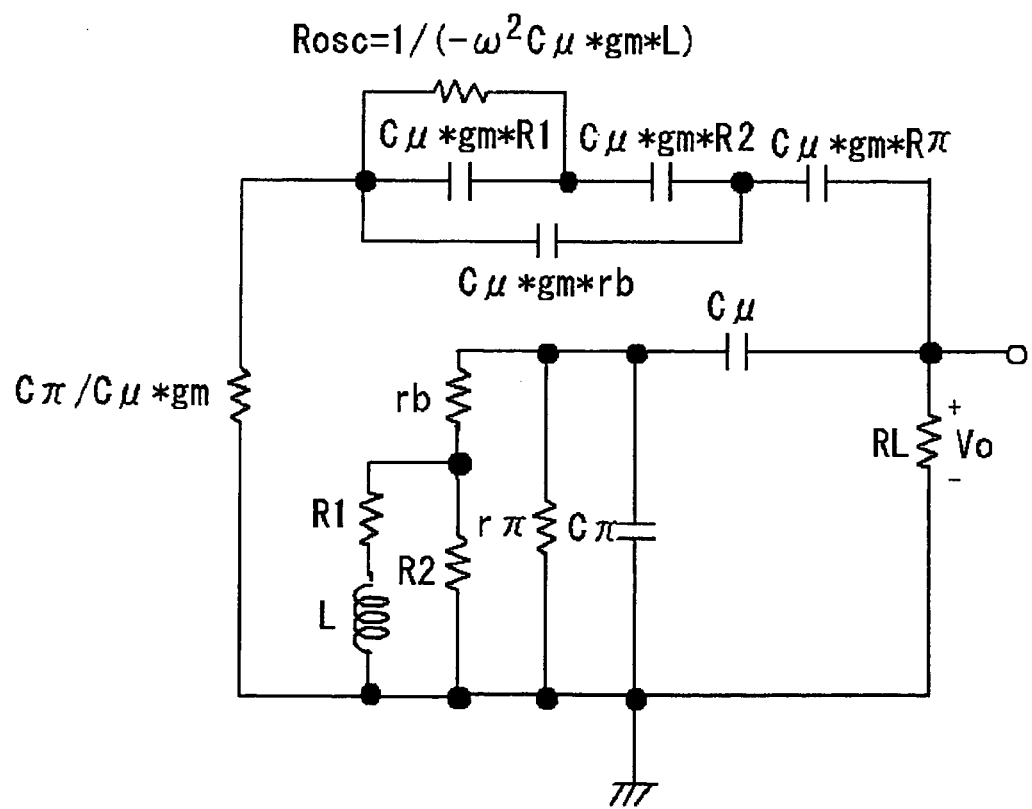
(b)

DRIVER CIRCUIT

BACKGROUND OF THE INVENTION

1. Field of the Invention

A driver circuit of the present invention relates to an output driver circuit the output signal of which is connected to an input of a device in the next stage via a member having a parasitic inductance such as a wire and performs current drive or voltage drive and, more specifically, to a drive circuit in which the effect of the parasitic inductance that varies according to applied material and packaging can be reduced, and good output matching and wide band characteristics can be maintained.

2. Description of the Related Art

Recently, as the Internet becomes widespread, transmission rates required for an IC for optical communication is ever-increasing into 10 Gb/s to 40 Gb/s. In order to realize the speeding up of the IC, it is necessary that high speed response characteristics of transistors constituting the IC are improved, and characteristic deterioration such as band limiting at the time of mounting is suppressed. Especially, in an LC circuit constituted by a parasitic capacitance (a pad capacitance, an output capacitance of a transistor, etc.) of the output end of an IC or a parasitic inductance such as a wire connected to the input of a device in the next stage, band limiting and output mismatching becomes a factor of characteristic deterioration.

In order to solve the problem, conventionally, a filter as shown in FIG. 19.6.2 of "40 Gb/s 2:1 Multiplexer and 1:2 Demultiplexer in 120 nm CMOS," ISCCC Digest of Technical Papers, pp. 344–345, 2003 is constituted at the output end of the IC.

A conventional configuration example of a driver circuit having the filter of the above document is shown in FIG. 11. In FIG. 11, an IC chip 1 as the driver circuit has a pair of differential transistors Q1, Q2, a constant current source I1 connected between emitter terminals of the pair of differential transistors Q1, Q2 and a negative voltage terminal within the IC for setting current driving in the pair of differential transistors Q1, Q2, emitter follower transistors Q3, Q4 for inputting output signals drawn from the emitter terminals of themselves to base terminals of the pair of differential transistors Q1, Q2, constant current sources I2, I3 connected between the emitter terminals of the emitter follower transistors Q3, Q4 and the negative voltage terminals within the IC, respectively, for setting current flowing in the emitter follower transistors Q3, Q4, terminating resistors R1, R2 for IC internal matching connected to collector output terminals of the pair of differential transistors Q1, Q2, inductors L1, L2 connected between the collector outputs of the pair of differential transistors Q1, Q2 and a positive voltage terminal within the IC via the terminating resistors R1, R2, respectively, bonding pads P1, P2 respectively provided on differential output parts of the IC chip 1, inductors L3, L4 inserted between the collector output terminals of the pair of differential transistors Q1, Q2 and the bonding pads P1, P2, respectively, a bonding pad P5 connected to the positive voltage within the IC, and a bonding pad P6 connected to the negative voltage within the IC.

A wire L9 connects the pad P5 and a positive voltage source on the mounting substrate, a wire L10 connects the pad P5 and the negative voltage source on the mounting substrate.

A light output part 2 driven by the IC chip 1 includes an optical modulator D and a resistor R3 connected in parallel with the modulator, and an anode of the optical modulator D is connected to the pad P5 through a wire L5 and a cathode of the optical modulator D is connected to a positive voltage source. Further, a terminating resistor R4 is connected between the pad P2 and the positive voltage source via a wire L6.

In the driver circuit in FIG. 11, the wideband characteristics of the IC are realized by the effects of the inductors L1, L2 serially connected to the terminating resistors R1, R2, respectively, for inductor peaking, and the inductors L3, L4 connecting the respective collector outputs of the pair of differential transistors Q1, Q2 and the IC output pads P1, P2. Further, the filter is constituted by the on-chip inductors (L1 to L4), output capacitances of the pair of differential transistors Q1, Q2, the pad capacitances of P1, P2, and the bonding wires L5, L6 and, by optimizing the L value, the cutoff frequency of the filter itself can be made sufficiently higher so that the cutoff frequency may not become a factor of the band limiting of the entire IC. Further, characteristic impedance of the filter can be set to desired values by the optimization of the L value. The improvement in bands and good output matching characteristics have been realized by the output circuit having such a filter.

Moreover, in "20 Gb/s transimpedance preamplifier and modulator driver in SiGe bipolar technology", IEE Electron Lett. Vol. 32, No. 13, pp. 1136 to 1137, 19, Jun., 1997), rising/falling time of an output waveform is improved by inserting a bonding wire in serial with a terminating resistor.

In the driver circuit having the filter in the conventional form, inductances of the wires L5, L6 are required to be specified at the time of design. However, in a driver for driving a laser diode or an optical modulator, for example, there are some cases where used packages are different according to their application, the driver is bare chip mounted for miniaturization of a module and a transmission unit, or an IC and an optical element are spaced and connected by a long wire by intention so that the effect of heat generation of the IC may not adversely affect the characteristics of the optical element. On this account, it has become difficult to uniquely determine inductances of the wires L5, L6 in advance.

Therefore, despite the fact that the filter is provided, there has been a problem that band deterioration and output mismatching can not be suppressed sufficiently due to the effect of inductances that vary according to packaging. Furthermore, in the case where the filter is constituted in a driver circuit having the conventional form in which the signal from the emitter follower is amplified, there has been a problem that, as described in detail below, the characteristics of the emitter follower affect the output impedance of the driver circuit and output capacitances of the pair of differential transistors Q1, Q2 do not appear to be ideal capacitances; thereby, good filter characteristics can not be obtained.

The effect on the output impedance of the differential amplifier when output impedance of the differential amplifier, the output impedance of the emitter follower, and the emitter follower are connected to the input will be described below. Basic equivalent circuits of the differential amplifier are shown in FIGS. 12a to 12c. FIG. 12a is a circuit diagram of the differential amplifier including the transistors Q1, Q2 and the terminating resistors R1, R2. When a differential signal is input to the differential amplifier in FIG. 12a, the common emitter point becomes a virtual grounded point, and the differential amplifier can be replaced by a single-ended equivalent circuit. Therefore, the small-signal equivalent circuit is shown by FIG. 12b (see "Analysis and Design of Analog Integrated Circuits-Fourth Edition-").

In FIG. 12b, RS denotes an output impedance of an input signal source, rb denotes a base resistor, rπ denotes an input resistor, Cπ denotes a base-emitter capacitance, Cμ denotes a base-collector capacitance, gm denotes a transconductance, RL denotes a resistance value of the terminating resistor R1 or R2, vi denotes a voltage of the signal source, v1 denotes a voltage applied to both ends of the resistor rπ, and vo denotes an output voltage drawn from both ends of the resistor RL.

FIG. 12c shows an output impedance equivalent circuit obtained from the equivalent circuit in FIG. 12b. As shown in FIG. 12c, the output impedance of the transistor Q1 or Q2 is represented by two CR series circuits connected in parallel. Of these two CR series circuits, because the magnitude of a capacitance proportional to gm varies according to the condition of the collector current of the transistor Q1 or Q2, when the collector current is large, the impedance of the CR circuit constituted by the capacitance proportional to gm becomes small and dominant; however, because, in a condition in which the transistor is off, the capacitance proportional to gm becomes smaller than Cμ as gm becomes smaller, in turn, the impedance of the CR circuit constituted by Cμ becomes dominant. Consequently, the output capacitance of the transistor Q1 or Q2 is estimated as C of the either dominant CR circuit.

FIG. 13 shows S22 (a voltage reflection coefficient indicative of the relationship between the input voltage and the reflection voltage) as S parameter of the differential amplifier in a condition in which the collector current is relatively larger plotted on a Smith chart. It is also seen from FIG. 13 that the output impedance of the differential amplifier is represented by a parallel circuit of the load resistor RL and the CR series circuit, that is, the output impedance of the transistor is represented by the CR series circuit. Therefore, in the case of constituting the filter, the filter is designed in consideration of the value of C in the CR series circuit estimated from the Smith chart.

Next, the output impedance of the emitter follower will be described. Basic equivalent circuits of the emitter follower are shown in FIGS. 14a to 14c. FIG. 14a is a circuit diagram of the emitter follower circuit including the transistor Q3 or Q4. Further, the small-signal equivalent circuit of the emitter follower circuit is shown by FIG. 14b. Since the output impedance equivalent circuit obtained from the equivalent circuit performs inductive operation in the case where I2 and I3 are equal to or more than several hundred micro amperes and 1/gm=(RS+rb) in a high-speed circuit, the output impedance equivalent circuit is represented as shown in FIG. 14c (see "Analysis and Design of Analog Integrated Circuits-Fourth Edition-").

FIG. 15 shows S22 of the emitter follower plotted on the Smith chart. It is also seen from FIG. 15 that the output impedance of the emitter follower is represented with inductivity.

Thus, when the output impedance of the emitter follower shows inductivity and the emitter follower is connected to the input part of the differential amplifier, the effect on the output impedance of the differential amplifier is shown in FIGS. 16a, 16b and 17. FIG. 16a shows an equivalent circuit of the differential amplifier when the emitter follower is connected to the input of the differential amplifier, and the output impedance RS of the input signal source in FIG. 12b is replaced by the output impedance Zout_ef of the emitter follower.

FIG. 16b shows an output impedance equivalent circuit obtained by the equivalent circuit shown by FIG. 16a. Since a resistor Rosc inversely proportional to square of frequency ω appears in the equivalent circuit, and a parallel resonant circuit of Cπ and L is formed, the output impedance of the transistor Q1 or Q2 can not be regarded as a simple CR series circuit.

FIG. 17 shows S22 of the differential amplifier when the emitter follower is connected to the input of the differential amplifier. Compared to S22 shown in FIG. 13, the graph has a form bulging toward outside and this reflects the effect of the resistor Rosc. Thus, the inductive operation of the output of the emitter follower affects the output impedance of the differential amplifier and, as a result, the operation also affects the filter characteristics of the driver circuit output having output capacitances of the pair of differential transistors Q1, Q2 as component elements; thereby, it becomes difficult to obtain a desired inductor peaking amount or output matching and that causes band deterioration or output mismatching.

SUMMARY OF THE INVENTION

The invention is achieved in order to solve the above-described problems, and the respective end terminals for IC internal termination are not connected to the external via wires in a condition in which they are mutually coupled within the IC, but the end terminals are connected to individually provided bonding pads (P3, P4), respectively, and the respective bonding pads (P3, P4) and voltage sources are connected by individual wires (L7, L8) that function as inductors.

Even in the case where wire lengths or wire shapes of the output terminals vary according to packaging, by determining the wire lengths of the connected wires (L7, L8) suitably, the inductor peaking amount or output matching can be optimized; thereby, waveform distortion when mounting can be reduced and wide band characteristics can be realized. Furthermore, by inserting resistors between the emitters of the transistors having emitter follower configuration and input parts of the pair of differential transistors, the resistors function as damping resistors to a resonator circuit produced by coupling of the emitter follower outputs and emitter grounded base inputs; thereby, the effect by adding transistors having emitter follower configuration can be reduced and more ideal filter characteristics can be realized.

BRIEF DESCRIPTION OF THE DRAWINGS

FIGS. 12a to 12c are equivalent circuit diagrams of a basic differential circuit;

FIGS. 14a to 14c are equivalent circuit diagrams of a basic emitter follower;

FIGS. 16a and 16b are equivalent circuit diagrams when the emitter follower is connected to the input of the differential circuit.

DESCRIPTION OF THE PREFERRED EMBODIMENTS

First Embodiment

Figure 1:
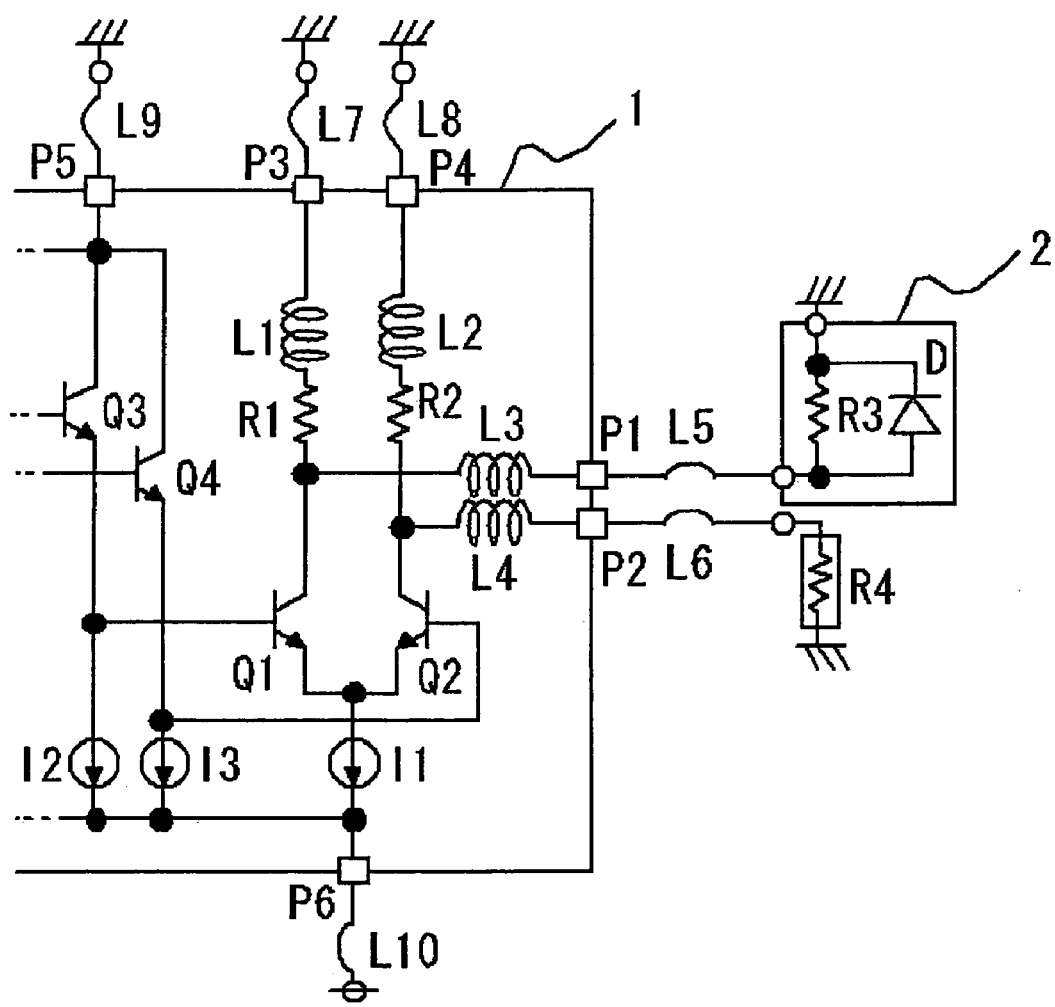
FIG. 1 is a circuit diagram of a driver circuit according to a first embodiment.
Figure 11:
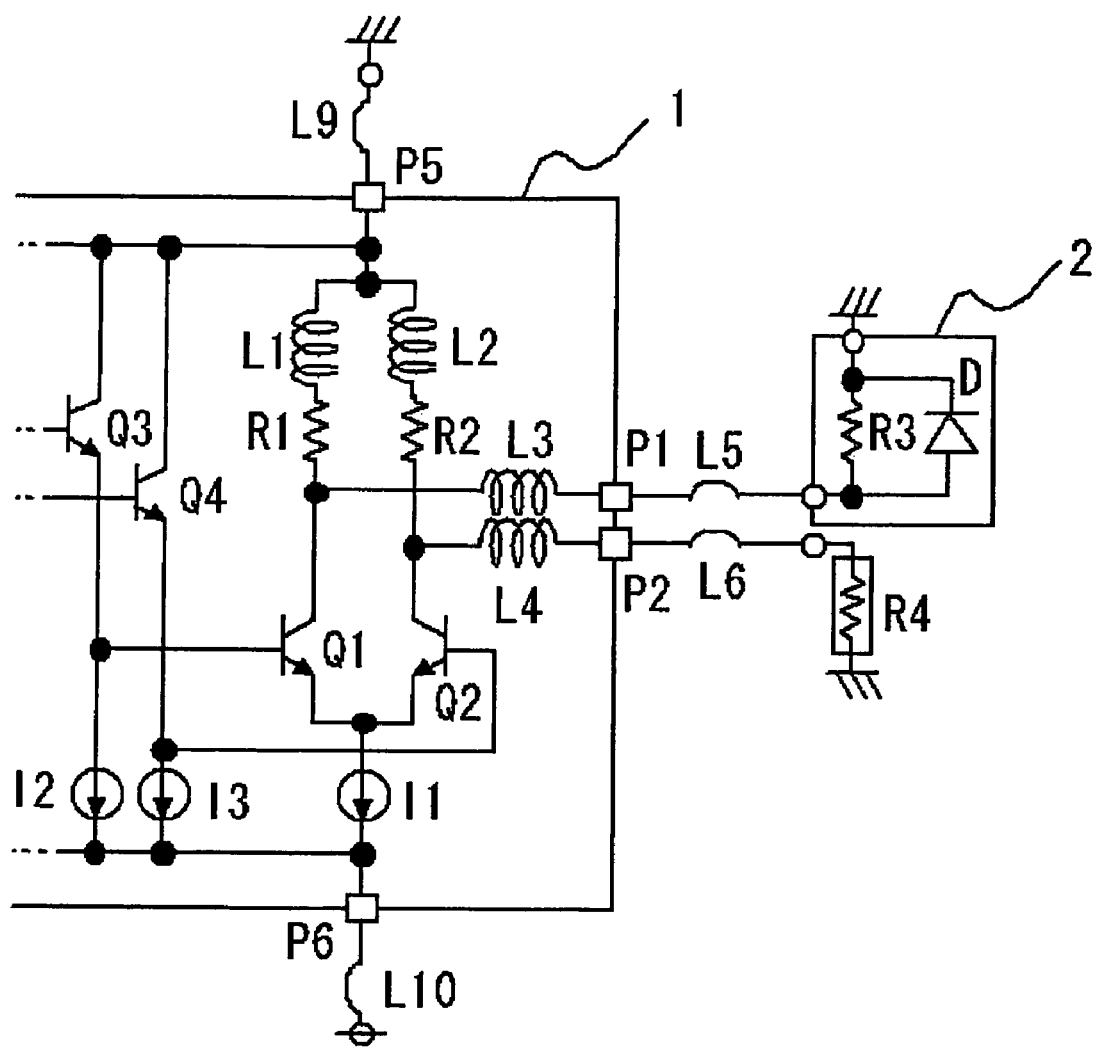
FIG. 11 is a circuit diagram of the conventional driver circuit.
Figure 13:
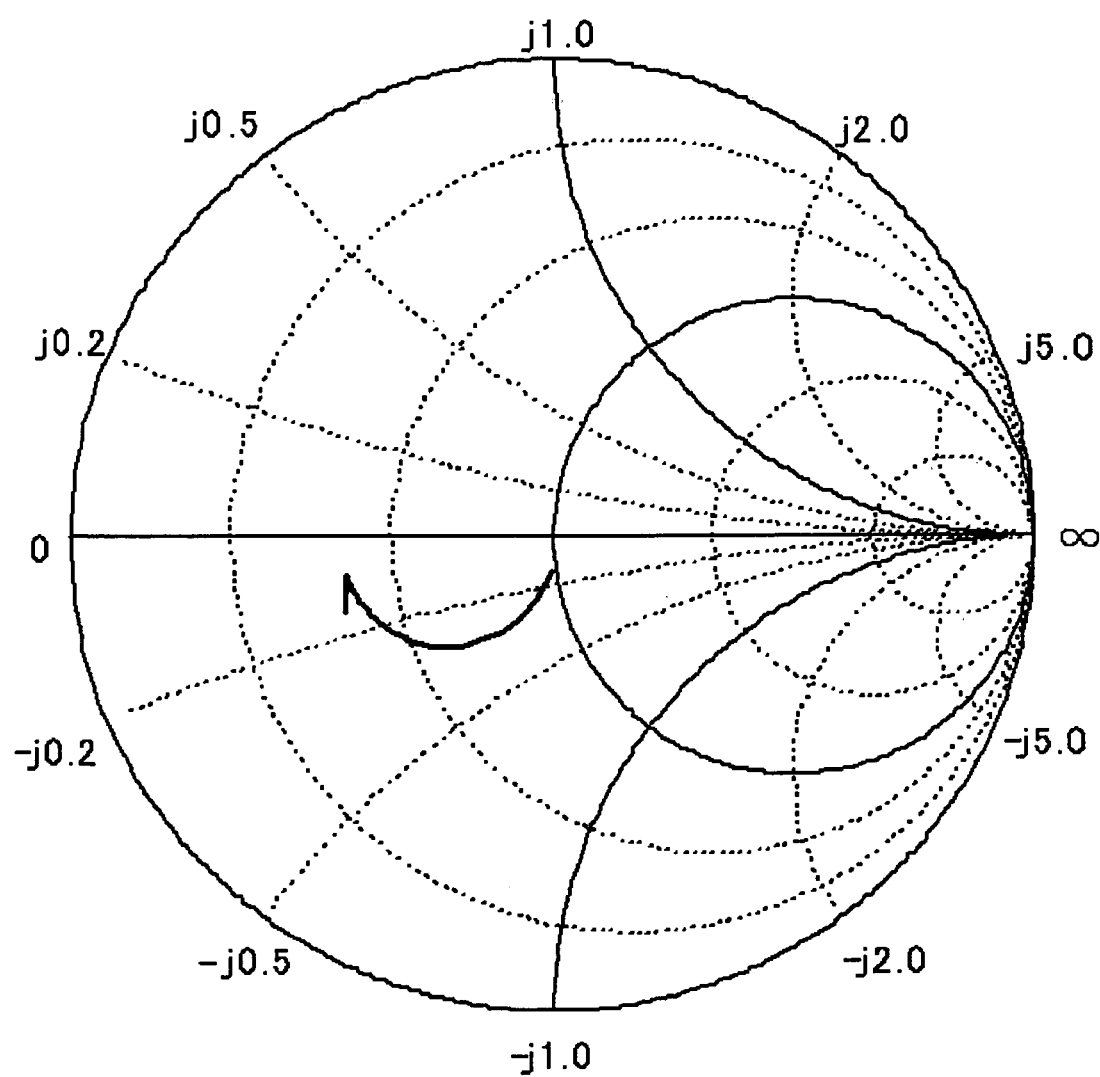
FIG. 13 is a Smith chart of S22 of the basic differential circuit.
Figure 15:
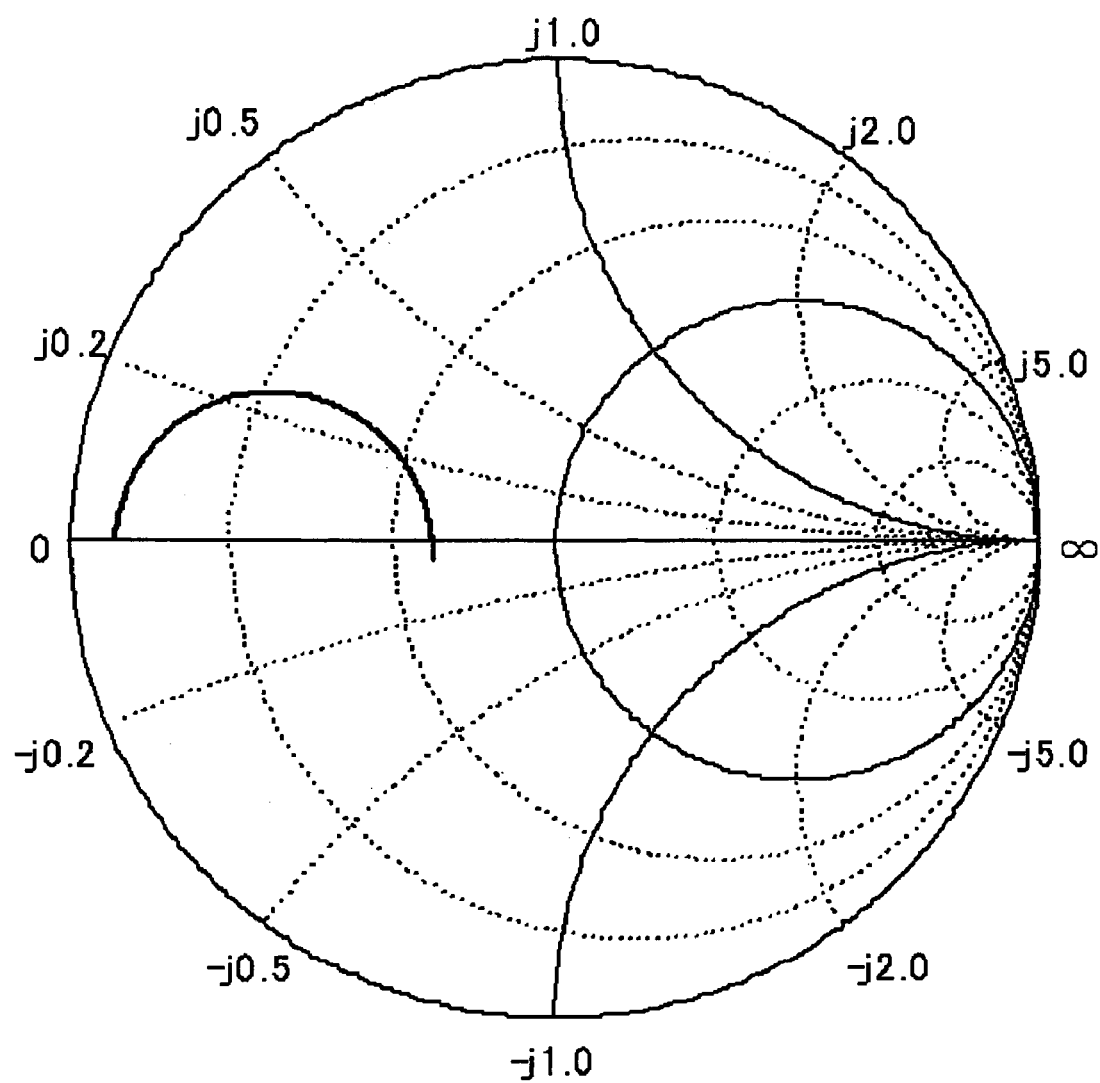
FIG. 15 is a Smith chart of S22 of the basic emitter follower.

FIG. 1 shows a configuration example of a driver circuit according to a first embodiment of the invention. As seen by comparison with the circuit in FIG. 11, in FIG. 1, respective end terminals for IC internal termination are not connected to each other, but the respective end terminals of the pair of differential transistors Q1, Q2 and the collectors of the transistors Q3, Q4 in the previous stage are connected to individual bonding pads P3, P4, P5, and the respective bonding pads P3, P4, P5 are connected to positive voltage sources through wires L7, L8, L9, respectively.

By changing the wire lengths of the wires L7, L8 and the like, the value of inductance can be adjusted. If the inductors L3, L4 at the output terminals become longer in packaging and the inductances thereof become larger than those when the IC is designed, the resistor when seeing the light output part 2 or the terminating resistor R4 from the bonding pads P1, P2 as output terminals becomes higher at high frequencies and the output signal loss become larger; thereby, the band is deteriorated. However, if the inductances of the wires L7, L8 are simultaneously made larger, the load resistors of the transistor Q1, Q2 becomes larger at high frequencies and the peaking amount increases; thereby, the band deterioration due to the loss can be compensated.

Figure 2:
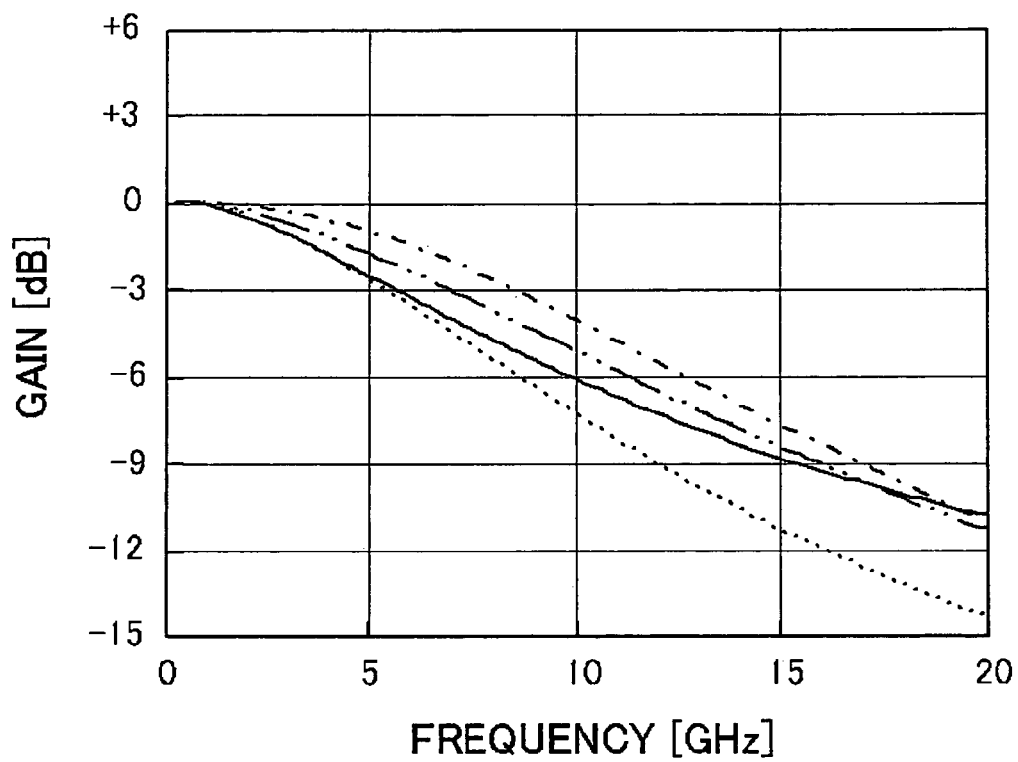
FIG. 2 shows gain-frequency characteristics of the driver circuit according to the first embodiment and a conventional driver circuit.
Figure 3:
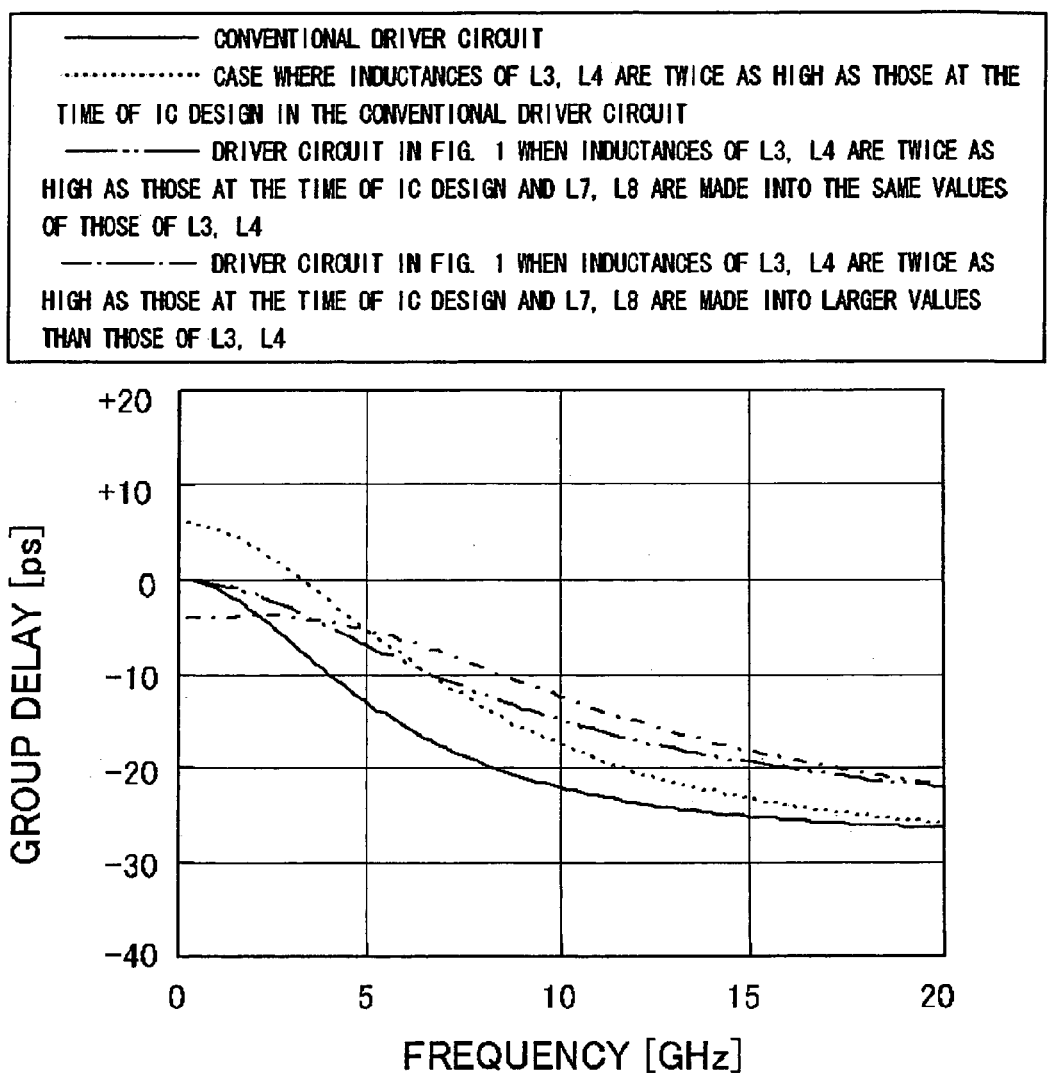
FIG. 3 shows group delay characteristics of the driver circuit according to the first embodiment and the conventional driver circuit.
Figure 4:
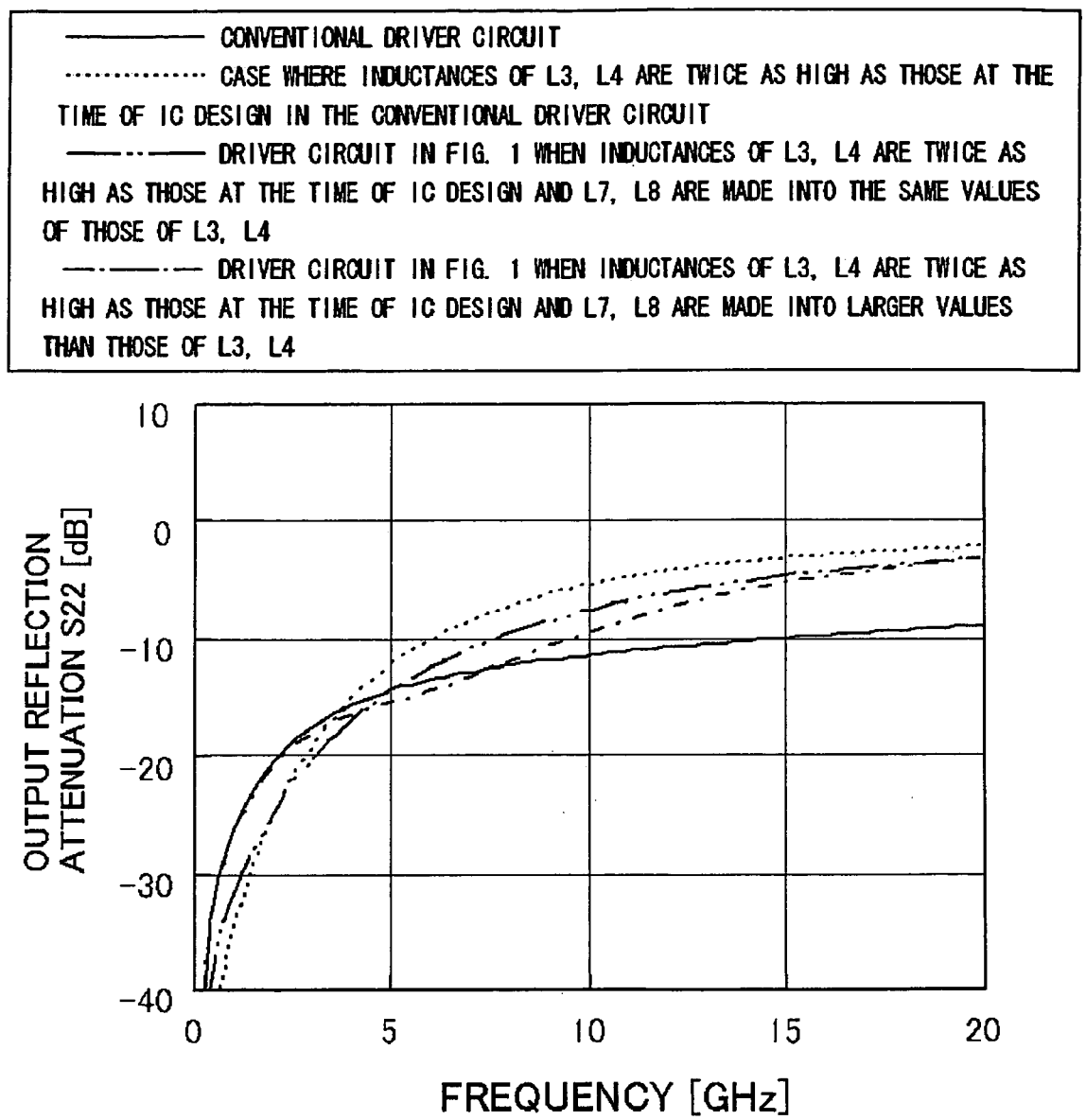
FIG. 4 shows output reflection attenuation S22 of the driver circuit according to the first embodiment and the conventional driver circuit.

The band improvement effect caused by the inductance insertion by the wires L7, L8 is shown in FIGS. 2 to 4. In FIG. 2, the solid line shows frequency characteristics of gain of the driver circuit having the conventional filter, the dotted line shows frequency characteristics when the inductances of the inductors L3, L4 of the output terminal of the driver circuit having the conventional configuration become twice as high, the chain double-dashed line shows frequency characteristics when the configuration of the first embodiment is applied in the condition in which the inductances of the inductors L3, L4 are made twice as high and the inductances of the inductors L7, L8 are made into the same as those of the inductors L3, L4, and the dashed line shows frequency characteristics when the wires L7, L8 having larger inductances than L3, L4 are inserted in the configuration of the first embodiment.

In the case where the values of L3, L4 become larger than the design values in the conventional circuit, the band becomes deteriorated at high frequencies equal to or more than 4 GHz. However, by inserting L7, L8 as in the first embodiment, the band can be wider than that of the conventional circuit. FIG. 3 shows group delay frequency characteristics in the above-described respective conditions. It can be seen that, when the inductances of the output wires L3, L4 become larger than those when designed, the amount of change in the group delay frequency characteristics relative to change in frequency has a tendency to increase at the high frequency zone; however, by inserting L7, L8, the amount of change in the group delay frequency characteristics can be suppressed. FIG. 4 shows output reflection attenuation S22 characteristics in the above-described respective conditions. In the conventional circuit, L3, L4 become larger than those when designed, and thereby, the output reflection attenuation at high frequencies becomes deteriorated. However, by changing the lengths of the wires L7, L8 in the configuration of the first embodiment, the output reflection attenuation is improved.

Second Embodiment

Figure 5:
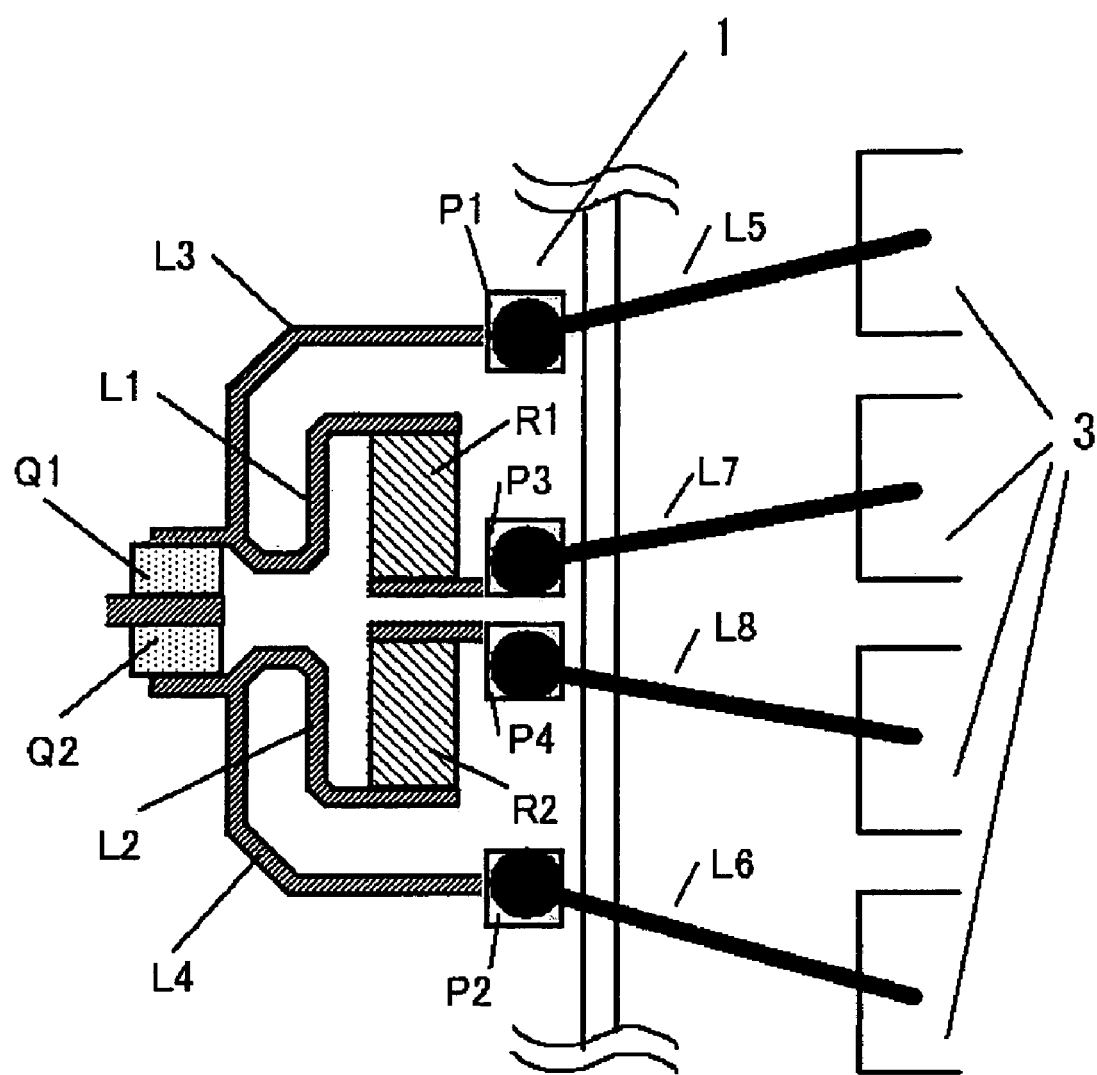
FIG. 5 is a specific layout diagram of a filter part of a driver circuit according to a second embodiment.

FIG. 5 shows a specific layout example of the filter part in the driver circuit according to the first embodiment of the invention. In FIG. 5, reference number 3 denotes leads of the package. As shown in FIGS. 2 to 4, in order to compensate for the characteristic deterioration caused by that the wires L5, L6 become longer, the wires L7, L8 are needed to be made longer correspondingly. As shown in FIG. 5, when the pads P1, P2, P3, P4 are arranged on the same side of the IC chip 1, even if, with the distance between the chip 1 and the mounting lead 3, the lengths of L5, L6 change according to variations of the chip position with respect to each packaging form or packaging, the lengths of L7, L8 change correspondingly; thereby, the effect on the driver characteristics by the lengths of L5, L6 can be automatically compensated.

Third Embodiment

Figure 6:
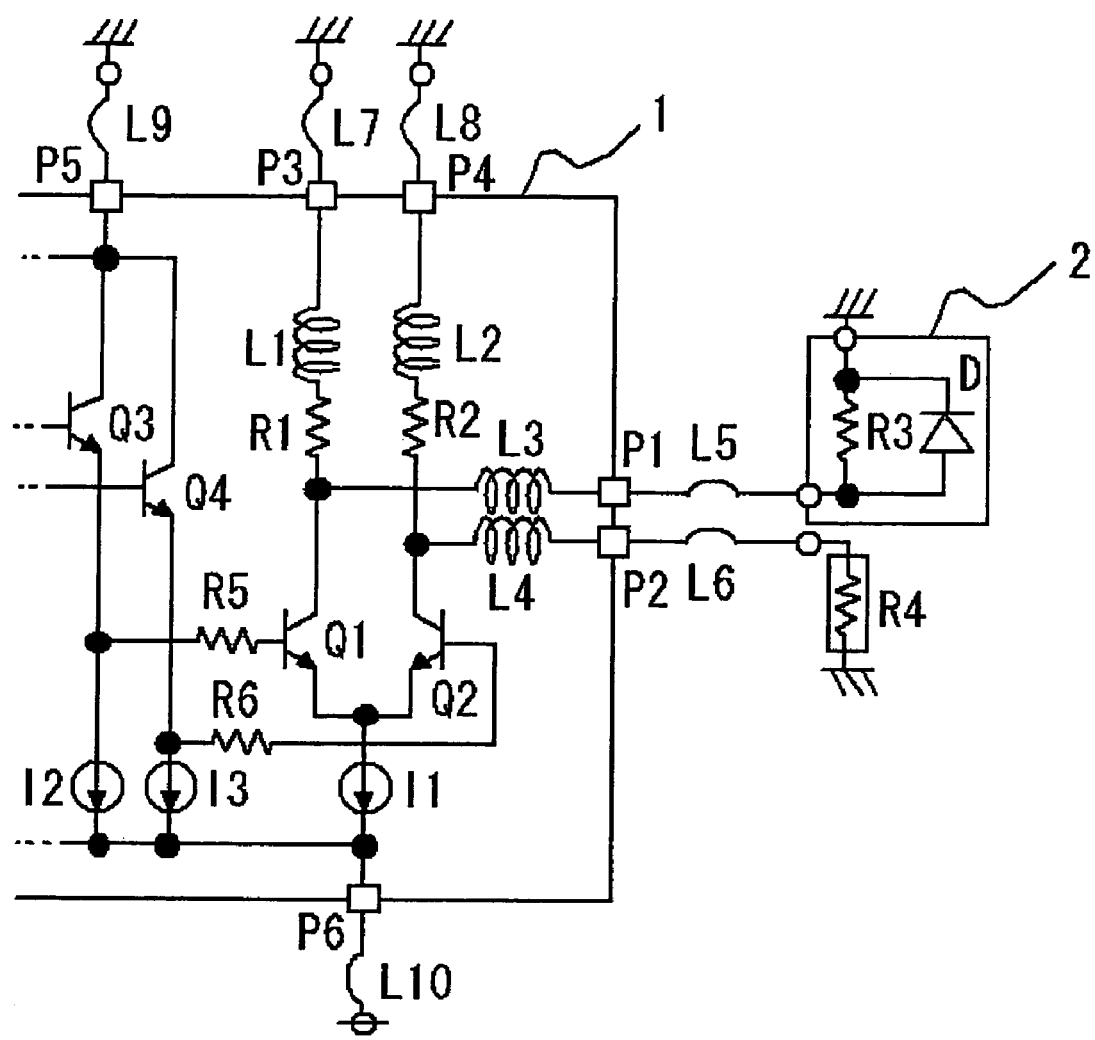
FIG. 6 is a circuit diagram of a driver circuit according to a third embodiment.

FIG. 6 shows a configuration example of a driver circuit according to a third embodiment of the invention. Compared to the circuit in FIG. 1, in FIG. 6, resistors R5, R6 are inserted between the respective emitter outputs of the emitter follower transistors Q3, Q4 and the respective base inputs of the pair of differential transistors Q1, Q2, respectively.

The resistors R5, R6 serve as damping resistors to the resonator circuit formed by coupling of the emitter follower outputs and the emitter grounded base inputs. Insertion of the resistors R5, R6 equal to increase in the value of rb in FIG. 16b. As rb increases, the capacitance represented by Cμ*gm*rb connected in parallel to Rosc increases. If the capacitance increases and the impedance become sufficiently smaller than Rosc, the effect of Rosc becomes difficult to be seen. As well as in the parallel resonator circuit of Cπ and L, damping effect of the resonator circuit is obtained by increasing rb serially connected to L.

Figure 7:
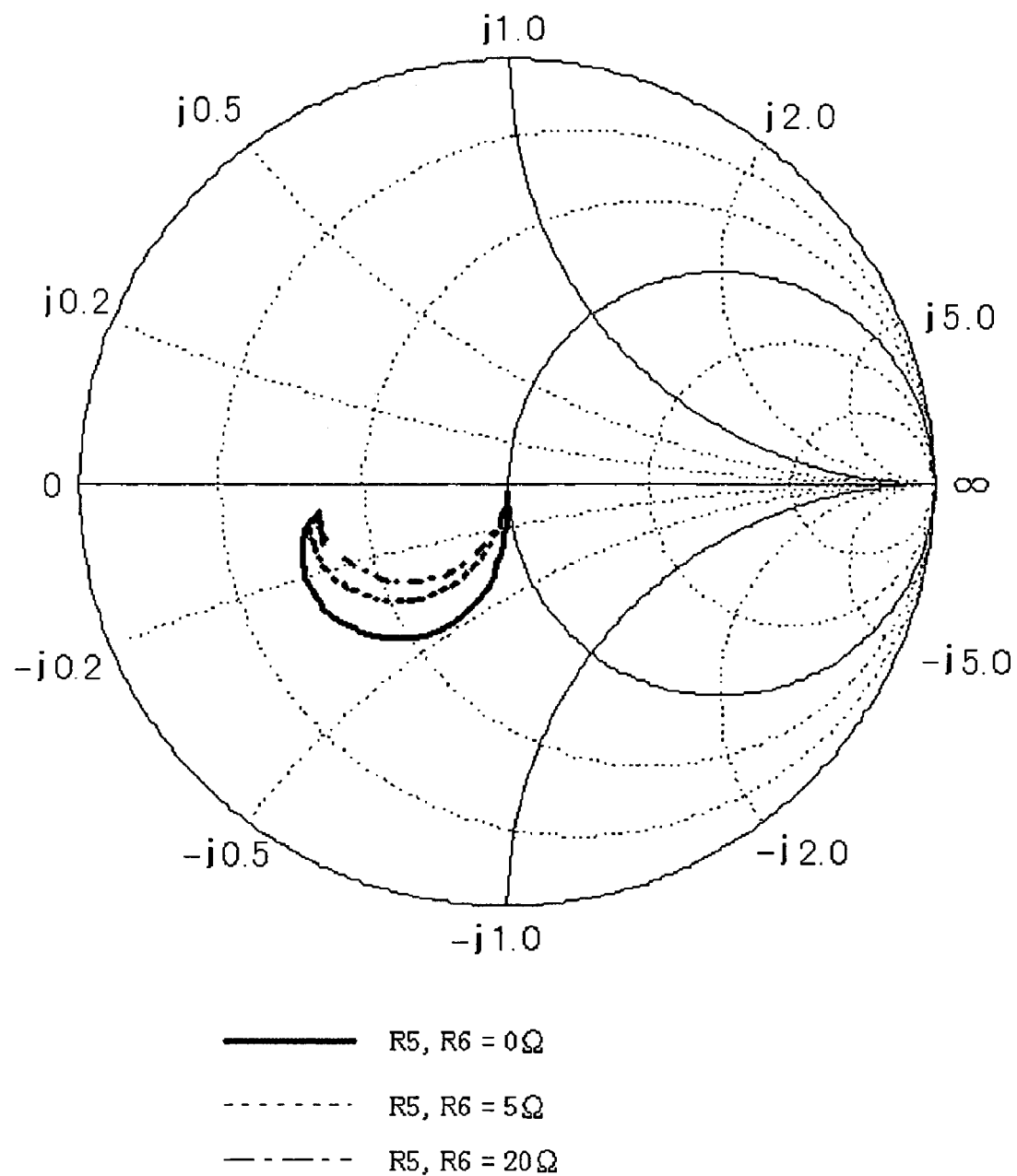
FIG. 7 shows damping resistance value dependency of S22 when an emitter follower is connected to an input of a differential circuit.
Figure 17:
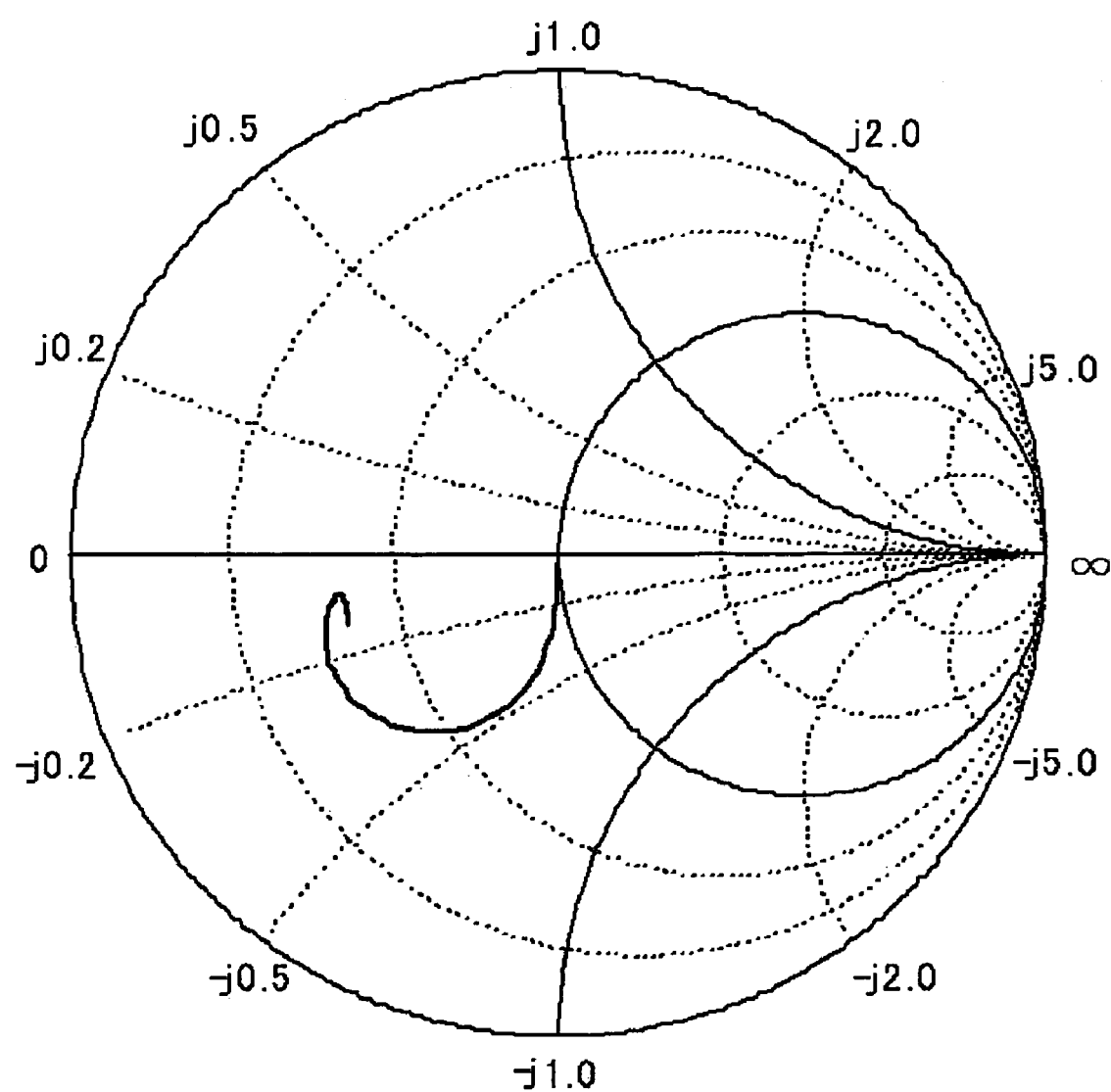
FIG. 17 is a Smith chart of S22 when the emitter follower is connected to the input of the differential circuit.

In FIG. 7, the solid line shows S22 when there is no damping resistor, the dotted line shows S22 when R5, R6 are set to 5 Ω, and the dashed line shows S22 when R5, R6 are set to 20 Ω. It can be seen that, as the resistance is increased, the form is becoming in agreement gradually with the S22 characteristics shown in FIG. 17. Thus, even if the impedance of the emitter follower exhibits inductivity, the inserted resistors R5, R6 can suppress the effect thereby, and the output capacitances of the pair of differential transistors Q1, Q2 can be approximated to the ideal capacitance. Note that, since the insertion of the damping resistors R5, R6 is equal to increase in base resistor rb and, when the resistance value is increased improperly, band characteristics are affected, it is necessary to determine the optimum value by considering the trade-off relationship between the band characteristics and output matching characteristics.

As a result of such optimization of the damping resistance value, the output capacitances of the pair of differential transistors of the driver circuit is approximated to the ideal capacitance; thereby, the filter design of the driver circuit output becomes easier and more ideal filter characteristics can be realized.

Fourth Embodiment

Figure 8:
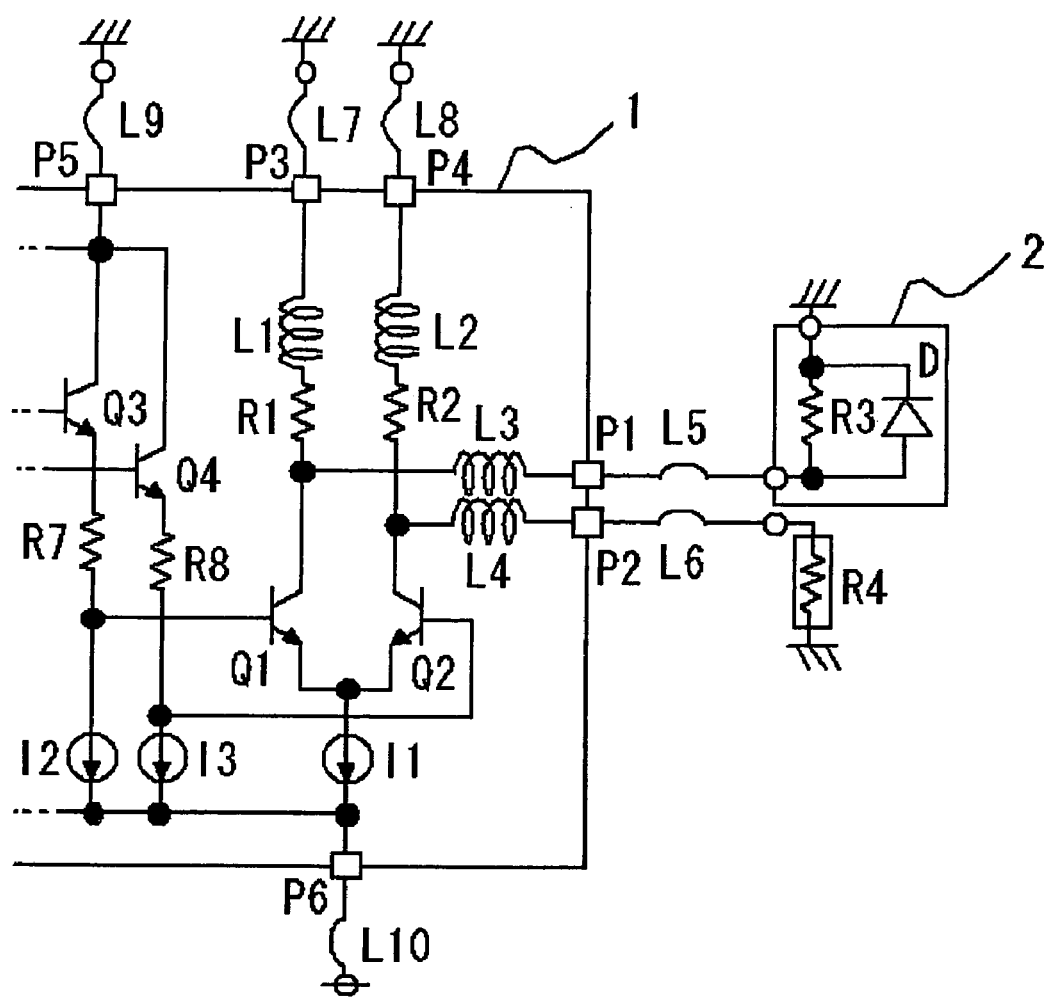
FIG. 8 is a circuit diagram of a driver circuit according to a fourth embodiment.

FIG. 8 shows a configuration example of a driver circuit according to a fourth embodiment of the invention. Compared to the circuit in FIG. 1, in FIG. 8, the resistors R7, R8 are inserted between the respective emitter outputs of the emitter follower transistors Q3, Q4 and the current sources I2, I3, respectively, and signals to the base inputs of the pair of differential transistors Q1, Q2 are drawn out from the coupled points of the respective resistors and the current sources.

Such insertion of the resistors R7, R8 is equal to insertion of damping resistors between the outputs of the emitter follower transistors Q3, Q4 and the base inputs of the pair of differential transistors Q1, Q2 in series as in the equivalent circuit; thereby, the same effect as in the third embodiment is exerted.

Fifth Embodiment

Figure 9:
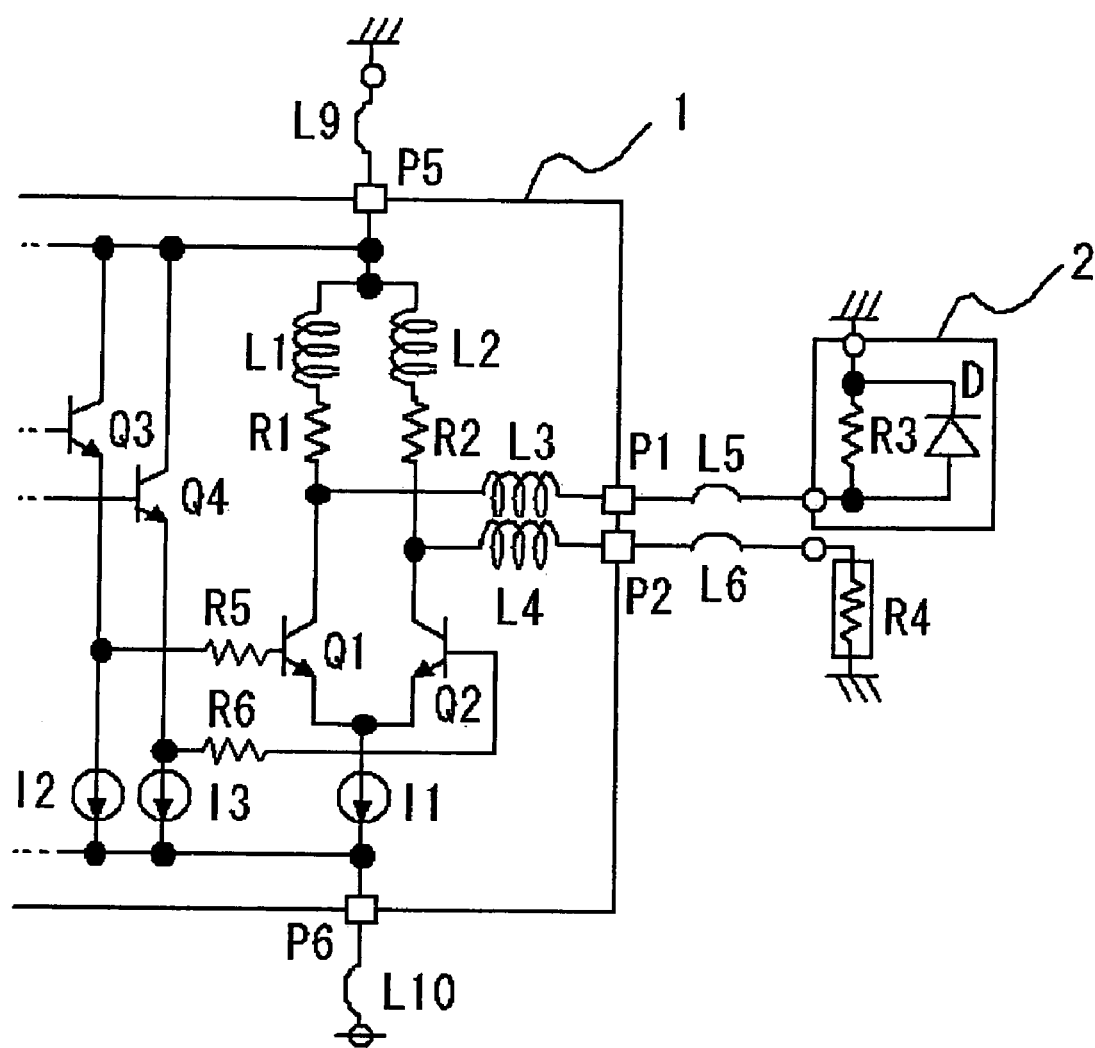
FIG. 9 is a circuit diagram of a driver circuit according to a fifth embodiment.

FIG. 9 shows a configuration example of a driver circuit according to a fifth embodiment of the invention. The circuit in FIG. 9 is a circuit in which the damping resistors R5, R6 shown in the second embodiment are applied to the conventional driver circuit in FIG. 11 and, in the circuit configuration, the effect on the output impedance of the differential amplifier by the inductive operation of the output impedance of the emitter follower is also suppressed, so that the same effect as the third embodiment is exerted.

Sixth Embodiment

Figure 10:
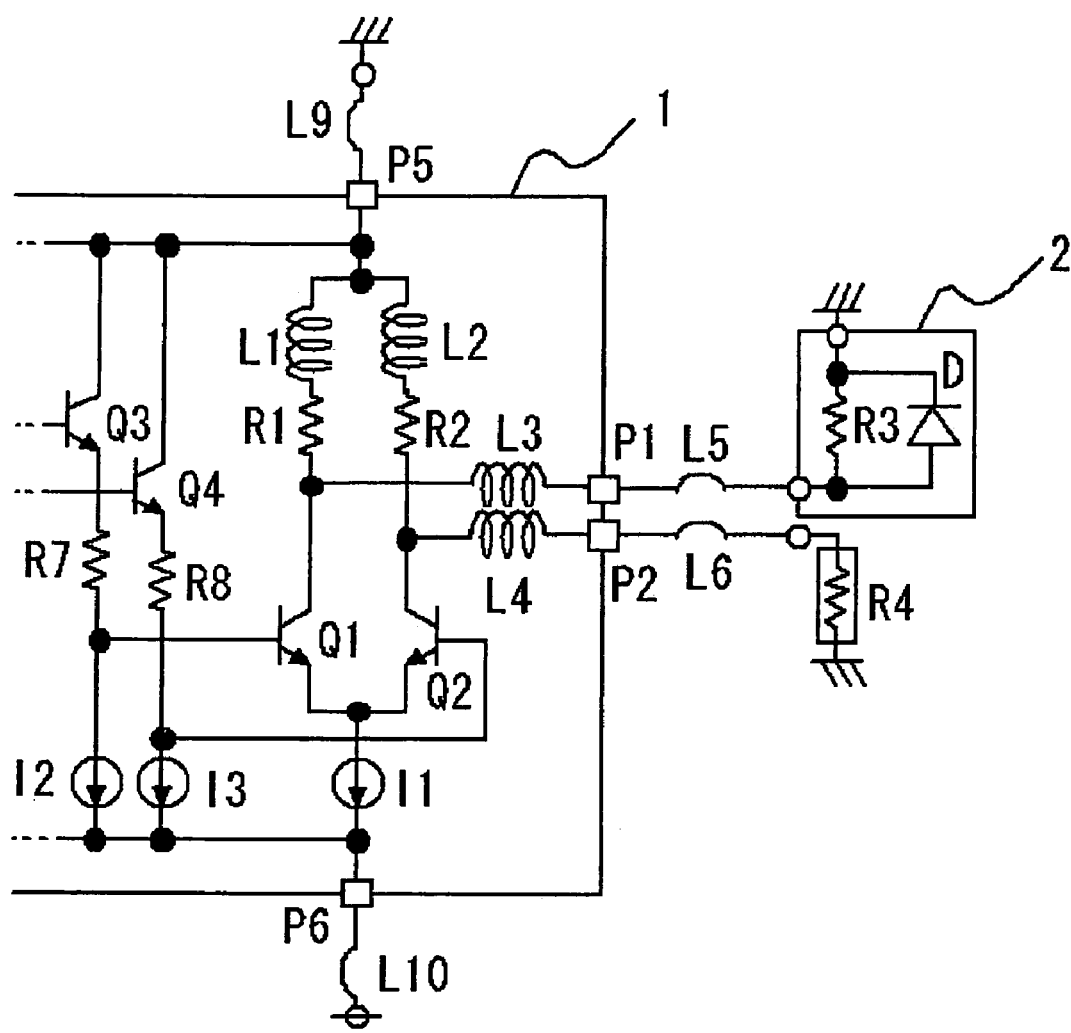
FIG. 10 is a circuit diagram of a driver circuit according to a sixth embodiment.

FIG. 10 shows a configuration example of a driver circuit according to a sixth embodiment of the invention. The circuit in FIG. 10 is a circuit in which the damping resistors R7, R8 shown in the third embodiment are applied to the conventional driver circuit in FIG. 11 and, also in the circuit configuration, the effect on the output impedance of the differential amplifier by the inductive operation of the output impedance of the emitter follower is suppressed, so that the same effect as the third embodiment is exerted.

What is claimed is:

1. A driver circuit comprising:

transistors each having an emitter follower configuration;

a pair of differential transistors having control electrodes for receiving outputs from the emitters of the transistors of the emitter follower configuration, respectively; and resistors inserted between the emitters of the transistors of the emitter follower configuration and the base of differential transistors, wherein end terminals of the pair of differential transistors are connected to individual bonding pads, and the respective bonding pads and voltage sources are individually connected by wires that function as inductors.

2. A driver circuit according to claim 1, wherein lengths of the wires are increased/decreased according to values of inductors provided at output terminals of the pair of differential transistors.

3. A driver circuit according to claim 1, wherein bonding pads at output terminals of the pair of differential transistors and the bonding pads for the end terminals are arranged on the same side of a chip on which the driver circuit is mounted.

* * * * *